June 18, 1968 R. H. FICHTNER 3,389,344
HUM COMPENSATION OF A TRANSISTOR AMPLIFIER
Filed July 2, 1965 2 Sheets-Sheet 1

INVENTOR.
ROLAND H. FICHTNER
BY
[signature]

INVENTOR.
ROLAND H. FICHTNER
BY

United States Patent Office 3,389,344
Patented June 18, 1968

3,389,344
HUM COMPENSATION OF A TRANSISTOR AMPLIFIER

Roland H. Fichtner, Waterloo, Ontario, Canada, assignor to Dominion Electrohome Industries Limited, Kitchener, Ontario, Canada

Filed July 2, 1965, Ser. No. 469,197
8 Claims. (Cl. 330—19)

ABSTRACT OF THE DISCLOSURE

A cascaded transistor amplifier has at least an input stage and an output stage of amplification, these stages including first and second transistors respectively. A power supply produces a D.C. voltage with a ripple component that is supplied to the emitter electrode of the second transistor. A hum compensating circuit is connected to the power supply and the first transistor for applying the ripple component between the base and emitter electrodes of the first transistor to produce a hum compensating signal in the output circuit of the first transistor. The hum compensating circuit includes first, second and third resistors connected in series circuit with each other between the live and grounded terminal of the power supply, and a fourth resistor and a capacitor connected in a second series circuit with the first resistor, the second series circuit also being connected between the live and grounded terminals of the power supply. The second resistor is connected between the first resistor and the base of the first transistor, while the third resistor is connected between the base of the first transistor and the grounded terminal. Means are provided for applying the hum compensating signal to the second transistor in the phase required to produce a collector current component in the collector electrode of the second transistor that is opposite in phase to a collector current component therein produced by application of the ripple component to the emitter electrode of the second transistor.

This invention relates to circuits for compensating for the hum signal which may be present as a component of the output signal of a cascaded transistor amplifier, and which is created by supplying the various stages of the amplifier with B+ having a large ripple component.

When a cascaded transistor amplifier that requires relatively large amounts of power is employed in a radio receiver, for example, it is expensive to provide a power supply that will provide a sufficiently filtered B+ to meet the demands of the amplifier without introducing appreciable hum from the ripple component of B+ into the output signal of the amplifier.

In accordance with this invention, circuits are provided for compensating for such hum signals by cancelling them out of or reducing their contribution to the output signal from a cascaded transistor amplifier. This is accomplished, in a transistor amplifier having a plurality of stages each including a transistor, the output stage having a load connected to the collector of the output transistor, by a circuit which alters the base to emitter voltage of a transistor in accordance with $V_R$, the ripple voltage component of B+, in a stage preceding the output stage and in such a manner that a current will flow in the collector circuit of the output transistor that will compensate, at least in part, for the current caused to flow in the collector circuit of the output transistor due to $V_R$.

Figure 1:
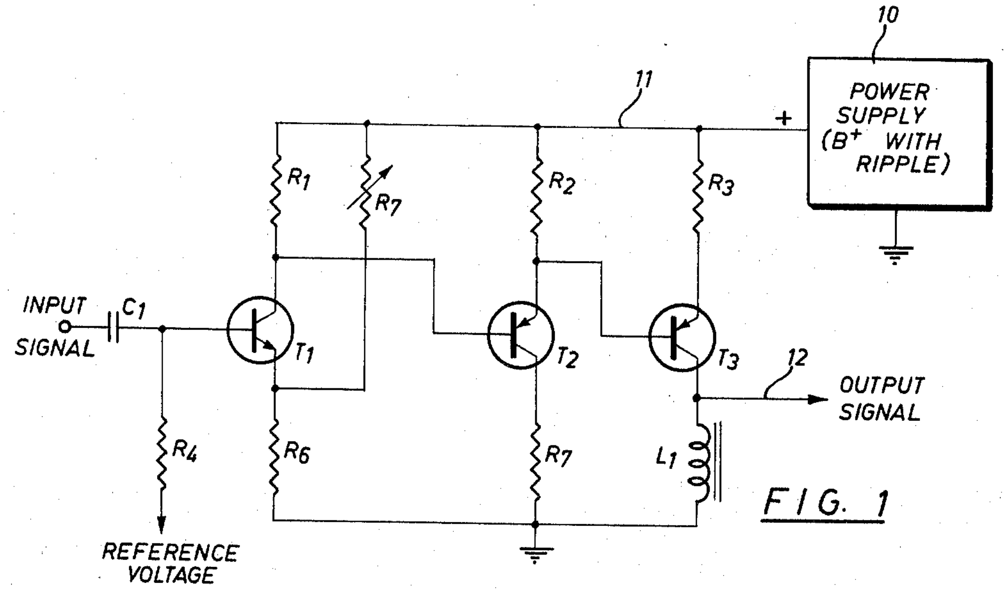
Figure 2:
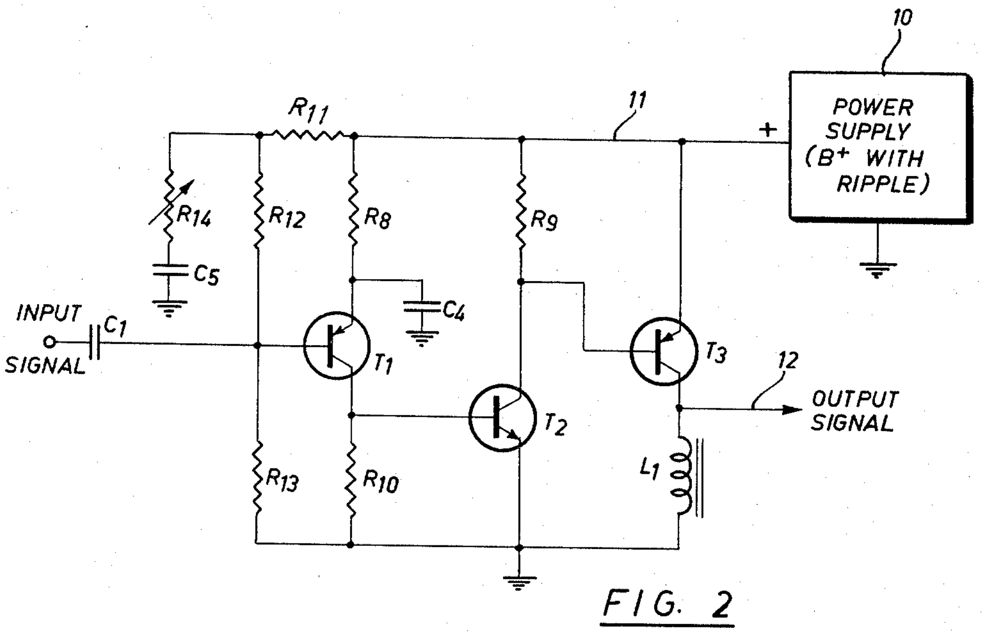
Figure 3:
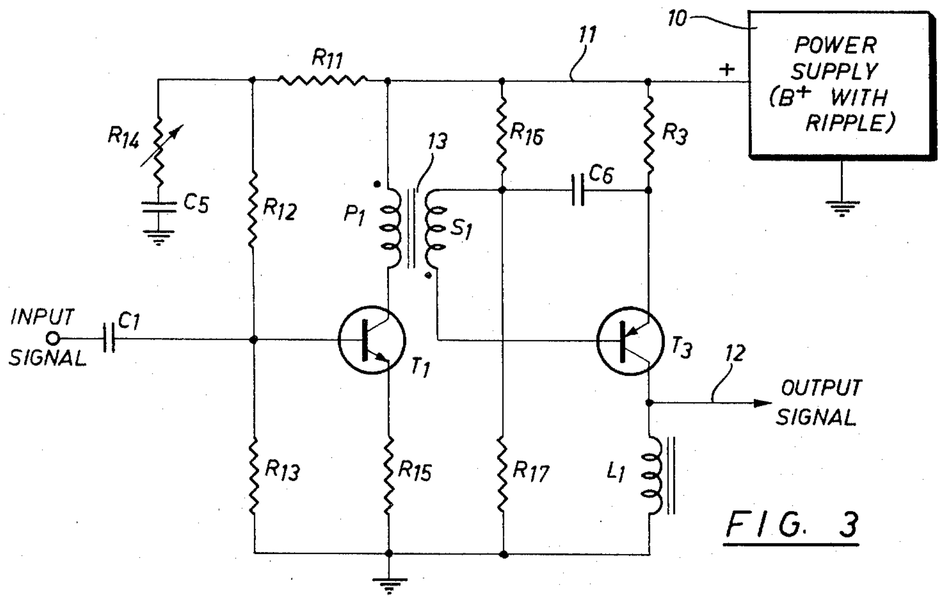
Figure 4:
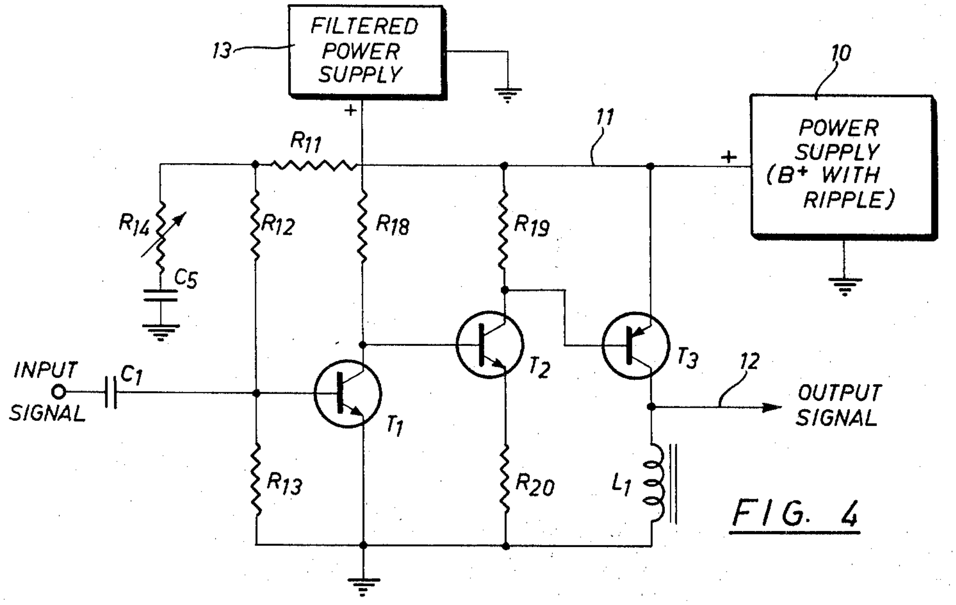

This invention will become more apparent from the following detailed description, taken in conjunction with the appended drawings, in which:

FIGURE 1 is a circuit diagram of a three-stage transistor amplifier with a hum compensation network, FIGURE 2 is a circuit diagram of a three-stage transistor amplifier employing a hum compensating circuit embodying this invention, FIGURE 3 is a circuit diagram of a two-stage transistor amplifier provided with a similar hum compensating circuit embodying this invention to that shown in FIGURE 2, and FIGURE 4 is a circuit diagram of another three-stage transistor amplifier employing a hum compensating circuit similar to that shown in FIGURES 2 and 3.

Referring to FIGURE 1, there is shown a three-stage, direct coupled transistor amplifier employing transistors T1, T2 and T3 each having base, collector and emitter electrodes conventionally designated as such in the figure.

A power supply 10 supplies a D.C. voltage, B+, having a ripple component $V_R$ to each transistor via a conductor 11, conductor 11 being connected to the collector electrode of transistor T1 in the first or input stage of the amplifier via a resistor R1, to the emitter electrode of transistor T2 in the second or intermediate stage of the amplifier via a resistor R2, and to the emitter electrode of transistor T3 in the third or output stage of the amplifier via a resistor R3. Transistor T1 is an NPN transistor, while transistors T2 and T3 are PNP transistors.

Input signals to be amplified by the amplifier are coupled to the base of transistor T1 via a coupling capacitor C1, and the base electrode of transistor T1 is biased by being connected to a reference voltage source (not shown), e.g., the positive terminal of a battery, via a resistor R4.

The emitter electrode of transistor T1 is connected to ground through a resistor R6.

The collector electrode of transistor T1 is connected directly to the base electrode of transistor T2, and the collector electrode of this latter transistor is returned to ground through a resistor R7.

The emitter electrode of transistor T2 is directly connected to the base electrode of transistor T3. A load impedance in the form of an inductance coil L1 is connected in series in the collector circuit of transistor T3, one terminal of coil L1 being grounded, and the other terminal of coil L1 being connected to the collector electrode of transistor T3.

Connected between conductor 11, and hence power supply 10, and the emitter of transistor T1 is a variable resistor R7. Resistors R7 and R6 constitute the hum compensation circuit for the amplifier of FIGURE 1.

Since Transistor T3 is connected to power supply 10, which produces B+ having a ripple component $V_R$, there will be a component of the collector current of transistor T3 that will vary in accordance with $V_R$. Assuming no compensation, this collector current component variation will result in a hum being present in the output signal from the amplifier obtained at output terminal 12, the hum level being dependent on the amplitude of $V_R$. To compensate for this, resistors R6 and R7 are provided. The ripple voltage $V_R$ divides across resistors R6 and R7 in accordance with the ratio of their resistances and is applied to the emitter electrode of transistor T1. Now, considering incremental changes, as $V_R$ increases, for example, the emitter voltage of transistor T1 increases, and the base-emitter voltage of transistor T1 decreases. This causes a collector current component of transistor T1 to decrease, in other words, to be out of phase with $V_R$, which, in turn, causes collector current components of transistors T2 and T3 to decrease thus compensating for the original collector current component in the collector circuit of transistor T3 due to the incremental change in $V_R$. If variable resistor R7 is set properly, any change in the collector current component of transistor T3 due to $V_R$ and because of the connection of transistor T3 to power supply 10 can be almost completely nullified.

Referring now to FIGURE 2, there is shown another three stage, direct coupled, transistor amplifier employing transistors T1, T2 and T3. As in the circuit of FIGURE 1, a power supply 10 supplies a D.C. voltage having a ripple component $V_R$ to each transistor via conductor 11. The emitter electrode of transistor T1 (PNP) is connected to conductor 11 via a resistor R8. The collector electrode of transistor T2 (NPN) is connected to conductor 11 via a resistor R9, and the emitter electrode of transistor T3 (PNP) is directly connected to conductor 11. As in the circuit of FIGURE 1, input signals are capacitively coupled to the base electrode of transistor T1 via capacitor C1, and inductance coil L1 is connected in the collector circuit of transistor T3, output signals being obtained at terminal 12.

The emitter electrode of transistor T1 is effectively grounded for A.C. by a capacitor C4 connected between ground and the emitter electrode of transistor T1. The collector electrode of transistor T1 is connected through a resistor R10 to ground.

The collector electrode of transistor T1 also is directly connected to the base electrode of transistor T2, the emitter of which is grounded. Similarly, the collector electrode of transistor T2 is directly connected to the base of transistor T3.

A resistive network consisting of three series connected resistors R11, R12 and R13 is connected between conductor 11 and ground, the common terminal of resistors R12 and R13 being connected to the base electrode of transistor T1. A series connected circuit consisting of a capacitor C5 and a variable resistor R14 is connected in parallel with the series circuit consisting of resistors R12 and R13. Capacitor C5 is a blocking capacitor that is provided so that A.C. voltage division can be accomplished by resistors R11 and R14 without interfering with D.C. conditions at the common terminal of resistors R11 and R12. It will be appreciated, of course, that resistors R11 and R14 and capacitor C5 function as a filter supplying D.C. bias to the base electrode of transistor T1. Resistor R14 is made variable to control the amplitude of the ripple voltage applied between the base and emitter of transistor T1.

In the operation of the circuit shown in FIGURE 2, $V_R$ is attenuated first by an amount equal to $$\frac{R14}{R11+R14}$$

and then by an amount equal to $$\frac{R13}{R12+R13}$$

Considering incremental changes, any increase in $V_R$ causes the base-emitter voltage of transistor T1 to decrease. This causes collector current components of transistors T1, T2 and T3 due to $V_R$ to decrease, i.e., to be out of phase with $V_R$, and by setting resistor R14 correctly, this decrease in the collector current component of T3 can be made sufficient to nullify the increase in the collector current component of transistor T3 caused by the increase in $V_R$ applied to transistor T3.

The embodiments of this invention set out in FIGURES 1 and 2 are direct coupled amplifiers. FIGURE 3 shows a two stage, A.C. coupled amplifier embodying this invention. Components in FIGURE 3 that correspond to those of FIGURES 1 and 2 are identified by the reference designations used in FIGURES 1 and 2.

The emitter electrode of transistor T1 (NPN) is connected through a resistor R15 to ground, while the collector electrode of transistor T1 is connected through the primary winding P1 of a transformer 13 to conductor 11.

One terminal of the secondary winding S1 of transformer 13 is connected to the base electrode of transistor T3 (PNP), while the other terminal is connected through a resistor R16 to conductor 11 and through a capacitor C6 to the emitter of transistor T3. Resistor R16 is connected in series with a resistor R17, the terminal of resistor R17 not directly connected to resistor R16 being grounded.

In the operation of the circuit of FIGURE 3, an incremental increase in $V_R$ which, of course, causes an increase in the collector current component of transistor T3 due to $V_R$, also causes an increase in the collector current component of transistor T1 due to $V_R$. Thus, the voltage across primary winding P1 increases. The voltage across secondary winding S1 is 180° out of phase with respect to the voltage across the primary winding, however, so that a collector current component results in the collector circuit of transistor T3 that is 180° out of phase with the collector current component in the collector circuit of transistor T3 caused by $V_R$. By the adjustment of R14 almost complete cancellation of this latter collector current component by the former can be achieved.

Referring now to FIGURE 4, there is shown another three stage, direct coupled transistor amplifier embodying this invention. In the circuit of FIGURE 4, the collector electrode of transistor T1 (NPN) is connected via a resistor R18 to a filtered power supply 13, while the emitter electrode of transistor T1 is grounded. The collector electrode of transistor T1 also is directly connected to the base electrode of transistor T2 (NPN). The collector electrode of transistor T2 is connected via a resistor R19 to conductor 11, while the emitter electrode of transistor T2 is connected through a resistor R20 to ground.

The collector electrode of transistor T2 also is directly connected to the base of transistor T3 (PNP), while the emitter of this latter transistor is directly connected to conductor 11.

In the circuits of FIGURES 1 and 2 an incremental increase in $V_R$ applied between the base and emitter of transistor T1 causes collector current components to flow in the collector circuits of transistors T1, T2 and T3 that are 180° out of phase with respect to the collector current component caused to flow in the collector circuit of transistor T3 by the application of $V_R$ to this transistor. In other words, the former collector current components decrease in response to an incremental increase in $V_R$, while the latter collector current component, similarly initiated, increases. In the circuit of FIGURE 4, an incremental increase in $V_R$ applied between the base and emitter electrodes of transistor T1 causes a collector current component to flow in the collector circuit of transistor T1 that is in phase with $V_R$, i.e., that increases as $V_R$ increases. However, this in turn results in collector current components of transistors T2 and T3 that are out of phase with the aforementioned collector current component of transistor T1, and the collector current component so produced in the collector circuit of transistor T3 compensates for the collector current component thereof that is in phase with $V_R$. The degree of compensation may be adjusted by varying the resistance of variable resistor R14.

The circuit of FIGURE 4 requires a filtered power supply. It will be appreciated that this need not be a separate power supply from power supply 10, but rather a part of the power from power supply 10 may be filtered and the output terminal of the filter connected to the collector electrode of transistor T1 via resistor R18. It is assumed, of course, that it would be prohibitively expensive to filter the whole output of power supply 10 for the transistor amplifier.

It should be noted that in FIGURES 1, 2 and 4 the circuits necessary to establish good D.C. stability have not been shown since they are not part of the instant invention and are known in the art.

From the foregoing it will be seen that in all embodiments of this invention an incremental change, e.g., an incremental increase in $V_R$ applied to the output stage of a multistage transistor amplifier causes a collector current component in the last stage that is in phase with $V_R$. However, $V_R$ is applied between the base and emitter of a stage preceding the output stage by means of a hum compensation circuit and produces a collector current component in this stage that, whether it is in phase or out of phase with $V_R$, results in a collector current component in the output stage that is out of phase with respect to the former collector current component in the output stage.

The portion of $V_R$ applied to the preceding stage should be capable of being adjusted to give just the correct degree of compensation to reduce the $V_R$ induced hum signal in the output signal of the amplifier to a minimum. This is the reason for employing variable resistor R7 in the circuit of FIGURE 1 and variable resistors R14 in the circuits of FIGURES 2–4.

It should be noted that the hum compensation circuits of this invention need not necessarily be provided by resistors. Thus, in FIGURE 1, resistor R7 could be a variable capacitor and resistor R6 a capacitor, or resistor R7 could be a variable inductance coil and resistor R6 an inductance coil. In other words, the hum compensation circuit is a voltage divider presenting an A.C. impedance and which will result in an output voltage in phase with the input voltage.

While preferred embodiments of this invention have been disclosed in detail, it will be appreciated that changes and modifications may be made therein without departing from the spirit and scope of this invention as defined in the appended claims.

The embodiments of the invention in which an exclusive property or privilege is claimed are defined as follows:

1. A cascaded transistor amplifier having at least an input stage of amplification, said input stage of amplification including a first transistor, said first transistor having a base electrode, a collector electrode and an emitter electrode and an output circuit, and an output stage of amplification, said output stage of amplification including a second transistor, said second transistor having a base electrode, a collector electrode and an emitter electrode; a power supply having first and second terminals and producing at said first terminal a DC voltage having a ripple component; means connecting said first terminal of said power supply to said emitter electrodes of said first and second transistors; means connecting said second terminal of said power supply to said collector electrodes of said first and second transistors; an AC bypass capacitor connected between said emitter electrode of said first transistor and said second terminal; a hum compensating circuit connected to said first terminal and to said first transistor for applying said ripple component between said base and emitter electrodes of said first transistor to produce a hum compensating signal in said output circuit of said first transistor, said hum compensating circuit including first, second and third resistors connected in series circuit with each other between said first and second terminals, and a series-connected fourth resistor and a capacitor connected in a second series circuit with said first resistor, said second series circuit being connected between said first and second terminals, said second resistor being connected between said first resistor and said base electrode of said first transistor, said third resistor being connected between said base electrode of said first transistor and said second terminal; and means for applying said hum compensating signal to said second transistor in the phase required to produce a collector current component in said collector electrode of said second transistor that is opposite in phase to a collector current component produced in said collector electrode of said second transistor by the application of said ripple component to said emitter electrode of said second transistor.

2. A cascaded transistor amplifier according to claim 1 wherein said last-mentioned means include a stage of amplification intermediate said input stage and said output stage, said stage of amplification intermediate said input stage and said output stage including a transistor having a base, a collector and an emitter electrode.

3. A cascaded transistor amplifier according to claim 2 wherein said output circuit is connected to said collector electrode of said first transistor, said last-mentioned means including means connecting said collector electrode of said first transistor to said base electrode of said transistor included in said stage of amplification intermediate said input stage and said output stage.

4. A cascaded transistor amplifier according to claim 1 wherein said last-mentioned means include a stage of amplification intermediate said input stage and said output stage, said stage of amplification intermediate said input stage and said output stage including a transistor having a base electrode, a collector electrode, an emitter electrode and an output circuit; said last-mentioned means also including means connecting said collector electrode of said first transistor to said base electrode of said transistor included in said stage of amplification intermediate said input stage and said output stage and means connecting said output circuit of said transistor included in said stage of amplification intermediate said input stage and said output stage to said base electrode of said second transistor.

5. A cascaded transistor amplifier according to claim 4 wherein said collector electrode of said first transistor is directly connected to said base electrode of said transistor included in said stage of amplification intermediate said input stage and said output stage and said output circuit of said transistor included in said stage of amplification intermediate said input stage and said output stage is directly connected to said base electrode of said second transistor.

6. A cascaded transistor amplifier according to claim 1 wherein the resistance of said fourth resistor is variable.

7. A cascaded transistor amplifier having at least an input stage of amplification, said input stage of amplification including a first transistor, said first transistor having a base electrode, a collector electrode and an emitter electrode and an output circuit, and an output stage of amplification, said output stage of amplification including a second transistor, said second transistor having a base electrode, a collector electrode and an emitter electrode; a power supply having first and second terminals and producing at said first terminal a DC voltage having a ripple component; means connecting said first terminal of said power supply to said collector electrode of said first transistor and to said emitter electrode of said second transistor; means connecting said second terminal of said power supply to said emitter electrode of said first transistor and to said collector electrode of said second transistor; a hum compensating circuit connected to said first terminal and to said first transistor for applying said ripple component between said base and emitter electrodes of said first transistor to produce a hum compensating signal in said output circuit of said first transistor, said hum compensating circuit including first, second and third resistors connected in series circuit with each other between said first and second terminals, and a series-connected fourth resistor and a capacitor connected in a second series circuit with said first resistor, said second series circuit being connected between said first and second terminals, said second resistor being connected between said first resistor and said base electrode of said first transistor, said third resistor being connected between said base electrode of said first transistor and said second terminal; and means for applying said hum compensating signal to said second transistor in the phase required to produce a collector current component in said collector electrode of said second transistor that is opposite in phase to a collector current component produced in said collector electrode of said second transistor by the application of said ripply component to said emitter electrode of said second transistor.

8. A cascaded transistor amplifier according to claim 7 wherein said means for applying said hum compensating signal to said second transistor includes a transformer having primary and secondary windings, said primary winding being connected in circuit with said collector electrode of said first transistor, said secondary winding being connected in circuit with said base electrode of said second transistor.

References Cited

UNITED STATES PATENTS

| | | | |
|---|---|---|---|
| 2,313,097 | 3/1943 | Shepard | 330—149 X |
| 3,030,504 | 4/1962 | Oschmann | 330—17 X |
| 3,096,487 | 7/1963 | Lee | 330—17 |
| 3,195,065 | 7/1965 | Grant | 330—40 X |

ROY LAKE, *Primary Examiner.*

J. B. MULLINS, *Assistant Examiner.*